US008262794B2

(12) United States Patent
Jundt et al.

(10) Patent No.: US 8,262,794 B2
(45) Date of Patent: Sep. 11, 2012

(54) LITHIUM NIOBATE WAFERS WITH NARROW DISTRIBUTION OF SURFACE ACOUSTIC WAVE PROPERTIES

(75) Inventors: Dieter Hans Jundt, Palo Alto, CA (US); Maria Claudia Custodio Kajiyama, San Jose, CA (US); John Thomas Carella, Mountain View, CA (US)

(73) Assignee: Crystal Technology, Inc., Palo Alto, CA (US)

( * ) Notice: Subject to any disclaimer, the term of this patent is extended or adjusted under 35 U.S.C. 154(b) by 446 days.

(21) Appl. No.: 12/408,413

(22) Filed: Mar. 20, 2009

(65) Prior Publication Data

US 2009/0235500 A1    Sep. 24, 2009

Related U.S. Application Data

(60) Provisional application No. 61/038,273, filed on Mar. 20, 2008.

(51) Int. Cl.
*C30B 15/20* (2006.01)
(52) U.S. Cl. ............... 117/13; 117/14; 117/15; 117/952
(58) Field of Classification Search ............... 117/13, 117/952, 14, 15
See application file for complete search history.

(56) References Cited

U.S. PATENT DOCUMENTS 5,310,448 A   5/1994  Bordui et al.
6,691,575 B2  2/2004  Kushibiki et al.

OTHER PUBLICATIONS

Abrahams, S. C., and Marsh, P., 1986. Defect structure dependence on composition in lithium niobate. Acta Crystallogr., Sect. B: Struct. Sci. 42, 61.
Baumann, I., 1994. Analysis of optically detected compositional inhomogeneities in Czochralski-grown LiNbO3. Journal of Crystal Growth 144, 193-200.
Bergman, J. G., Ashkin, A., Ballman, A. A., Dziedzic, J. M., Levinstein, H. J., and Smith, R. G., 1968. Curie temperature, birefringence, and phase-matching temperature variations in LiNbO3 as a function of melt stoichiometry. Applied Physics Letters 12, 92-94.
Birnie, D. P., and Bordui, P. F., 1994. Defect-based description of lithium diffusion into lithium niobate. J. Appl. Phys. 76, 3422-3428.
Bordui, P. F., Norwood, R. G., Jundt, D. H., and Fejer, M. M., 1992. Preparation and characterization of off-congruent lithium niobate crystals. J. Appl. Phys. 71, 875-879.
Byer, R. L., Young, J. F., and Feigelson, R. S., 1970. Growth of high-quality LiNbO3 crystal from the congruent melt. J. Appl. Phys. 41, 2320-2325.
Carruthers, J. R., Peterson, G. E., Grasso, M., and Bridenbaugh, P. M., 1971. Nonstoichiometry and crystal growth of Lithium niobate. J. Appl. Phys. 42, 1846-1851.
Jundt, D. H., and Kajiyama, M. C. C., 2008. Axial stoichiometry variations in lithium niobate crystals grown from near-congruent melts. J. Crystal Growth 310, 4280-4285.

(Continued)

*Primary Examiner* — Bob M Kunemund
(74) *Attorney, Agent, or Firm* — Paul Davis; Goodwin Procter LLP

(57) ABSTRACT

A method is provided of growing crystals from compounds that melt congruently with negligible volatilization. The composition of one or more crystal samples is measured. A determination is made of a deviation of crystal composition from congruency. A determination is made of an initial melt composition and a source material composition correction relative to the deviation. Crystals are grown using the composition correction to yield reproducible material for surface acoustic substrate manufacturing.

13 Claims, 6 Drawing Sheets

OTHER PUBLICATIONS

Kovacs, L., Ruschhaupt, G., Polgar, K., Corradi, G., and Wohlecke, M., 1997. Composition dependence of the ultraviolet absorption edge in lithium niobate. Applied Physics Letters 70, 2801-2803.

O'Bryan, H. M., Gallagher, P. K., and Brandle, C. D., 1985. Congruent composition and Li-rich phase boundary of LiNbO3. J. Am. Ceram. Soc. 68, 493-496.

Ruppel, C. C. W., Dill, R., Fischerauer, A., Fischerauer, G., Gawlik, W., Machui, J., Muller, F., Reindl, L., Ruile, W., Scholl, G., Schropp, I., and Wagner, K. C., 1993. SAW devices for consumer communication applications. IEEE Trans. Ultrasonics, Ferroelectrics, and Frequ. Control 40, 438-452.

Uda, S., Bungo, A., and Jian, C., 1999. Growth of 3-inch Langasite Single Crystal and Its Application to Substrate for Surface Acoustic Wave Filters. Japanese Journal of Applied Physics 38, 5516.

Wheeler, A. A., 1989. Boundary layer models in Czochralski crystal growth. Journal of Crystal Growth 97, 64-75.

Wooten, E. L., Kissa, K. M., Yi-Yan, A., Murphy, E. J., Lafaw, D. A., Hallemeier, P. F., Maack, D., Attanasio, D. V., Fritz, D. J., McBrien, G. J., and Bossi, D. E., 2000. A review of lithium niobate modulators for fiber-optic communications systems. IEEE Journal of Selected Topics in Quantum Electronics 6, 69-82.

Yamada, K., Tekemura, H., Inoue, Y., Omi, T., and Matsumura, S., 1987. Effect of Li/Nb Ratio on the SAW Velocity of 128°Y—X LiNbO3 Wafers. Japanese Journal of Applied Physics 26-2, 219-222.

IEC 62276 Ed.1: Single crystal wafers for surface acoustic wave (SAW) device applications—Specifications and measuring methods.

CrystalTechnologyInc optical-grade 2006.

SAES Getters optical-grade 2007.

Isowave optical-grade 2002.

CrystalTechnologyInc acoustic 2003.

Yamaju acoustic 2005.

LITHIUM NIOBATE WAFERS WITH NARROW DISTRIBUTION OF SURFACE ACOUSTIC WAVE PROPERTIES

CROSS-REFERENCE TO RELATED APPLICATIONS

This application claims the benefit of U.S. Provisional Application No. 61/038,273, filed Mar. 20, 2008, which is incorporated herein by reference in its entirety.

BACKGROUND

1. Field of the Invention

This invention relates generally to methods of making crystals, and more particularly to the growth and specification of crystals achieving highly reproducible performance for surface acoustic wave devices ("SAW").

2. Description of the Related Art

Suppliers of Lithium Niobate (LN) typically differentiate between LN for optical applications and that for surface acoustic wave (SAW) applications. Because crystals used for optical applications typically need better uniformity and lower optical loss, optical LN crystals typically use higher purity starting materials, shorter length of crystals, lower solidified fractions of melt volume to crystal volume for each growth run, and a more stringent inspection of the as-grown crystal. This lower efficiency of optical material growth translates into higher cost for a finished optical wafer as compared to SAW wafers.

SAW filters manufactured from LN substrates are utilized in many applications, for example in TV receivers and mobile communication base stations. The purpose of such a filter generally is to pass the signal frequencies in the pass band, and significantly attenuate those in the stop band. High performance filters often have requirements of attenuating certain frequencies to less than −65 dB as compared to the pass band frequencies.

A shift in substrate SAW velocity is detrimental to the filter manufacturing yield as it shifts the filter's frequency response. SAW wafer customers therefore require good velocity uniformity not only within a wafer, but also from wafer to wafer and from wafers cut out from different crystal over long time periods. At the same time, the SAW substrates need to be very cost effective to address the consumer's expectations of falling prices for electronics equipment. For the crystal producer, growing LN crystals from the melt, this requires conversion of the highest amount of melt into useful crystal material while at the same time controlling the SAW velocity within a narrow range. It has been shown that the major factor in SAW velocity variation for LN is a deviation in composition from congruency (K. Yamada, H. Tekemura, Y. Inoue, T. Omi, and S. Matsumura, "Effect of Li/Nb Ratio on the SAW Velocity of 128° Y-X LiNbO3 Wafers," Japanese Journal of Applied Physics 26-2(Supplement 26-2), 219-222 (1987)). The SAW velocity deviation from the center value due to compositional variation for the commonly used LN 128° wafers is 10900 ppm per mol % of lithium oxide. Other orientations of lithium niobate, or crystals that may be grown from melts close to congruency also will show a shift of SAW velocity with compositional changes.

Uniform crystals can be grown from the congruent composition, producing a crystal of the same composition as that of the melt. Early work on LN growth has determined the congruent composition to be $x_c=[Li]/([Li]+[Nb])=48.6\%$ (J. R. Carruthers, G. E. Peterson, M. Grasso, and P. M. Bridenbaugh, "Nonstoichiometry and crystal growth of Lithium niobate," J. Appl. Phys. 42, 1846-1851 (1971)). This value has been refined subsequently, first by Abrahams to 48.45%, and finally by Bordui to 48.38%. (S. C. Abrahams and P. Marsh, "Defect structure dependence on composition in lithium niobate,"Acta Crystallogr., Sect. B: Struct. Sci. 42, 61 (1986), and P. F. Bordui, R. G. Norwood, and J. L. Nightingale, "Composition for growth of homogeneous lithium niobate crystals," U.S. Pat. No. 5,310,448 (1994)).

LN substrate users would like wafer-to-wafer variability to be contained within narrow limits. One of the accepted methods for specifying crystal composition is by specifying a range for the Curie temperature with the correlation between composition and Curie temperature as described by Bordui et. al. (P. F. Bordui, R. G. Norwood, D. H. Jundt, M. M. Fejer, J. Appl. Phys. 1992, 71(2), 875-879). For optical grade LN, leading suppliers adhere to very tight specifications on Curie temperature. For example, Crystal Technology, Inc. states that optical wafers are "congruent within 0.02 mol %" which equates to a specification tolerance of ±0.7° C. for the Curie temperature. SAES Getters (Milano, Italy) also states a specification range of ±0.7° C., even though at a slightly different center value (1140 as opposed to 1142.3° C. for Crystal Technology, Inc.).

Other suppliers of optical LN typically have a less demanding specification. For example, Isowave (Dover, N.J.) cites compositional uniformity (within a wafer) of 0.02 mol % but does not call out a wafer to wafer repeatability. For acoustic, or SAW grade material, wafer price is a primary concern and the wafer manufacturer lowers cost as compared to optical growth by achieving a high melt solidified fraction. For SAW grade material, such values exceed 60% typically being above 85% (P. F. Bordui, et.al, U.S. Pat. No. 5,310,448 (1994)), incorporated herein by reference. Because of this high solidified fraction, the compositional control, and the specification for Curie temperature need to be relaxed. Most supplier's Curie specification for SAW wafers has a window of ±2° C. to ±3° C. (Yamaju Ceramics Co., Ltd; 1132±2° C., J&S Crystal Technology LTD. 1142±3° C., Crystal Technology, Inc. 1142.3±1.9° C.). When looking at those stated specification windows, one needs to be aware at how these are to be interpreted: The fact that all the leading suppliers state an absolute temperature indicates that the wafer to wafer (and crystal to crystal) variability is controlled within absolute values, even if the disparity in the stated numbers indicate large systematic differences in measurement methods or absolute temperature calibration.

Without additional information given in the specification, the specification is to be interpreted according to the relevant IEC standard (IEC 62276, Single crystal wafers for surface acoustic wave (SAW) device applications—Specifications and measuring methods Current specifications) in which the Curie range is specified to be no more than ±3° C. from the center value, and an AQL (acceptable quality level) of 2.5% is assumed for the listed defect groups collectively. Thickness specification, polish quality and cleanliness are quality classes that may also lead to some fallout, and one would expect that the crystal grower needs to control the Composition such that the Curie temperature exceeds the limit in no more than about 1% of wafers.

The first report on controlling weighing procedure for preparing the starting melt of LN is by O'Bryan (H. M. O'Bryan, P. K. Gallagher, and C. D. Brandle, "Congruent composition and Li-rich phase boundary of LiNbO3," J. Am. Ceram. Soc. 68, 493-496 (1985)). The authors dried the 99.999% pure powders at 500° C. for 12 to 14 hours, then weighed each with a relative precision to the reacted LN of $4 \times 10^{-5}$. The determination of composition was based on the assumption that the dried powders were pure compounds without any residual water or $Li_2O$ present. Bordui (P. F. Bordui, et al, J. Crystal Growth 113, 61-68 (1991)) also employed drying to account for moisture and additionally performed thermal ionization mass spectrometry to determine the atomic weight of lithium.

The corrections were then applied to the weighing recipe to produce a charge that was estimated to be accurate within ±0.01 mol %. In U.S. Pat. No. 5,320,448, the same authors describe the drying method to take place at 500° C. in air for 10 minutes before removing the powder sample and weighing it after another 10 minutes have elapsed. Moisture correction factors of 1.0058 for the carbonate and 1.0002 for the pentoxide were established. The prior art therefore takes into account some possible corrections that are needed and performs tests on the powders to estimate the necessary corrections.

However, it is not certain that these corrections account for all possible contaminants/or powder degradations. It is possible that some water is more tightly bound and not liberated at the 500° C. temperature. It is possible that organic contaminants are present in the powders. These contaminants are typically not tested for in the purity analysis and may be present in the tens of ppm amounts even for 99.999% pure powders. It is possible that a significant fraction of lithium carbonate dissociates into $Li_2O$ and $CO_2$ with one or both of those products volatilizing during the powder drying test.

There are other materials that melt congruently, for example Langasite ($La_3Ga_5SiO_{14}$) and similar compounds, but have to be grown with excess of one of the initial components, typically $Ga_2O_3$ to compensate for volatilization. The non-negligible volatilization makes it difficult to grow homogeneous crystals at large melt conversion fractions. Large non-uniformities have been observed in this material (S. Uda, A. Bungo, and C. Jian, "Growth of 3-inch Langasite Single Crystal and Its Application to Substrate for Surface Acoustic Wave Filters," Japanese Journal of Applied Physics 38(Part 1, No. 9B), p 5516 (1999)).

SUMMARY

An object of the present invention is to provide an improved method of forming crystals from compounds that melt congruently with negligible volatilization.

Another object of the present invention is to provide an improved method of forming crystals, from compounds that melt congruently with negligible volatilization, that allows for prediction of substrate SAW properties based on the starting melt composition.

A further object of the present invention is to provide an improved method of forming crystals, from compounds that melt congruently with negligible volatilization, which calculates an improved raw material weighing recipe based on measurements performed on one or more test growth runs.

Yet another object of the present invention is to provide an improved method of forming crystals, from compounds that melt congruently with negligible volatilization, that ensures consistent manufacturing of SAW substrates resulting in SAW properties limited to a narrower range than previously possible.

Still another object of the present invention is to provide an improved method of forming crystals, from compounds that melt congruently with negligible volatilization, that allows an SAW customer to achieve high production yields.

Another object of the present invention is to provide an improved method of forming crystals, from compounds that melt congruently with negligible volatilization, that results in a loosening of testing requirements for final SAW devices.

A further object of the present invention is to provide a method of forming crystals from compounds that melt congruently with negligible volatilization, that creates improved consistency in SAW properties together with high growth efficiency.

These and other objects of the present invention are achieved in, a method of growing crystals from compounds that melt congruently with negligible volatilization . The composition of one or more crystal samples is measured. A determination is made of a deviation of crystal composition from congruency. A determination is made of an initial melt composition and a source material composition correction relative to the deviation. Crystals are grown using the composition correction to yield reproducible material for surface acoustic substrate manufacturing.

DETAILED DESCRIPTION

Figure 1:
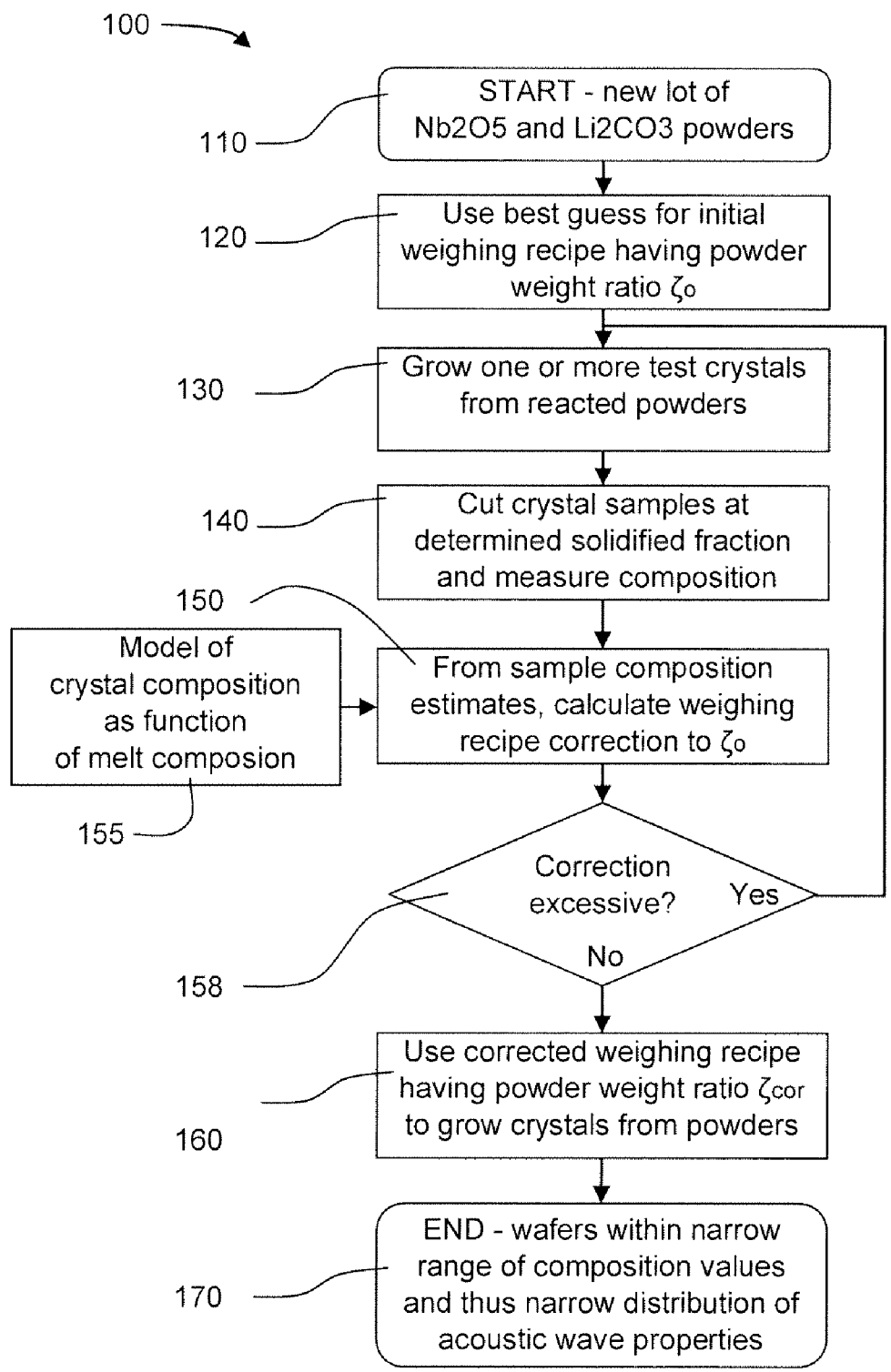
FIG. 1 is a schematic flow diagram illustrating a method to produce surface acoustic wave substrates within a narrow range of SAW properties.

The present invention provides an accurate model that predicts how the crystal composition develops during growth for a melt deviating slightly from the congruent composition, D. H. Jundt and M. C. C. Kajiyama, "Axial stoichiometry variations in lithium niobate crystals grown from near-congruent melts," J. Crystal Growth 310, 4280-4285 (2008)), incorporated herein by reference. The model applies to typical growth conditions for industrial crystal growth of LN and allows the prediction of substrate SAW properties based on the starting melt composition. A method is described that utilizes this model, or alternate approximations for the composition development during crystal growth, to calculate an improved raw material weighing recipe based on measurements performed on one or more test growth runs. The present invention ensures consistent manufacturing of SAW substrates resulting in SAW properties limited to a narrower range than previously possible. This allows the SAW customer to achieve high production yields and may also loosen testing requirements on final devices. The improved consistency in SAW properties together with high growth efficiency allows the SAW substrate user to design and manufacture high performance SAW devices at lower cost than was previously possible.

The present invention describes a method to produce a population of wafers with highly reproducible crystal properties that have a curie temperature within 1.84 degrees of the congruent temperature. For each new lot of starting powders, one or more test crystals are grown with an initial weighing recipe for the initial source materials. By way of illustrating, and without limitation, the crystal can be lithium niobate (LN) and the initial materials are $Li_2CO_3$ and $Nb_2O_5$. In one embodiment, the test crystal(s) is preferentially grown with a high solidified melt fraction that is at least 80% of the crystal weight/the original melt welt, e g the amount of melt converted into the crystal is 80% or more. In another embodiment, the amount of melt converted into the crystal is 85% or more.

Samples are cut from the test crystals at determined solidified melt fractions and the crystal composition is measured by dielectric or equivalent method. Depending on the compositional measurement uncertainty, a number of samples taken from various solidified melt fractions may need to be analyzed. The crystal composition measurements are used to estimate a weighing recipe correction. Using this corrected weighing recipe, the remainder of the powder lot is used to grow crystals with well controlled starting melt compositions This leads to production of wafers with surface acoustic wave properties contained in a narrow range of values than previously possible. For a typical specification interpretation where 1% of wafers are allowed to lie outside the specification window, the present invention allows a narrowing of the window from ±1.9K to less than ±1.65K. Fewer than 1000 ppm, or 0.1%, of produced wafers lie outside a window of ±1.84K when produced using the method and having reasonably accurate measurement methods to determine the composition of test samples. The corresponding SAW velocity variability is ±460 ppm from the center value for the 1% AQL specification, and ±515 ppm from the center value for the 1000 ppm or 0.1% wafer failure rate.

FIG. 1 illustrates one embodiment of a method 100 to produce surface acoustic wave (SAW) substrates with SAW velocity controlled within a narrow range, equal to or smaller than ±515 ppm from the center value. Suitable SAW devices include but are not limited to, filters, oscillators, delay lines and the like. In one embodiment, a method is provided for growing crystals made from compounds that melt congruently with negligible volatilization, including but not limited to LN, BSO ($Bi_{12}SiO20$), BGO ($Bi_{12}GeO_{20}$) and the like. It will be appreciated that throughout this specification the discussion of LN is also application to other compounds or crystals.

In one embodiment, the test crystal(s) is grown with a high solidified melt fraction, i.e. the crystal weight as a fraction of the original melt weight, that is 80% or more. In another embodiment, the amount of melt converted into the crystal is 85% or more.

The method of the present invention is applied whenever a new combination of powder lots is used for crystal growth and a correction in powder weights needed is likely. In most cases, with LN, this coincides when either the lithium carbonate ($Li_2CO_3$, "LCarb") or niobium pentoxide ($Nb_2O_5$, "NP") changes lot number. With the present invention the materials considered are formed from compounds that melt congruently with negligible volatilization. Suitable crystals include but are not limited to LN, BSO ($Bi_{12}SiO20$), BGO ($Bi_{12}GeO_{20}$). The weighing recipe that is used to grow the crystals determines the melt composition, and consequently the crystal composition and uniformity. There may be various ways to define a powder weighing recipe, but they all can be reduced to a single representative value denoted as $\zeta$, defined as the ratio of the powder weights measured out before mixing and reacting the powders. The weighing recipe ratio is defined as $\zeta$=(weight of LCarb powders)/(weight of NP powders). It will be appreciated that the present invention can also be used for pre-processed powders. Such processing steps may include drying or even pre-reacting large amounts of LCarb and NP powders to LN powders of stable, but not precisely known composition.

The reason for determining an accurate weighing recipe (step 150) is to minimize the chance of melt composition deviation from congruency with the resulting shift in wafer properties such as the SAW velocity. In other cases, it may be that the storage conditions allow moisture to be adsorbed, particularly likely for the LCarb powders, and a re-calibration of the weighing recipes is necessary. In that case, it is not the change of a supplier lot that initiates the method with process step 110, but a time duration elapsed during which the lot may have adsorbed moisture to the amount making a correction in weighing recipe necessary. Depending on the drying methods used by the powder suppliers, there may be a varying amount of moisture. A very high drying temperature for the LCarb powders also may lead to dissociation of LCarb into $CO_2$ and $Li_2O$, which has the inverse effect of underestimating the moles of Li in a weighed out charge for growing a crystal. The result of method 100 is a corrected weighing recipe, represented by a value $\zeta_{cor}$. The powders for consecutive growth runs (step 160) are weighed with the mass of the LCarb powder and the mass of the NP powder satisfying the ratio to be at that value $\zeta_{cor}$ for the corrected weighing recipe. The absolute weights depend on the lot size, the charge size to grow an individual crystal, and the weighing and mixing equipment used to weigh and mix (and/or react) the powders. Very large batches mixing powders for dozens of crystals may be indicated to minimize the effects of static charge separation, surface effects, mixing efficiency etc.

For the embodiment where pre-reacted powders are used, steps 120, 150 and 160 are modified as follows: The one or several test crystal(s) are grown from the reacted powders. A ratio $\zeta_0$ may not be known. The test crystals are analyzed using the model 155 and the estimate of the initial melt composition is determined as described below. The deviation of the initial melt composition from congruency for these powders is therefore known. If the Li content needs to be increased, addition of lithium-rich LN powder of known composition may be used to add to the large powder lot and mixed in thoroughly, and if Nb content needs to be increased, addition of NP powders is the most straightforward approach. The well mixed powders with the additions then serve as raw materials for the growths to yield SAW material with well controlled properties.

In process steps 120 and 130, one or several test crystals are grown from the powders for which a corrected weighing recipe is needed. In one embodiment, a previous recipe that was determined for powders from the same vendor is used as a starting point. Alternatively, drying tests (e.g. baking the powders at 500° C. for a few hours in a dry oxygen atmosphere) can be performed to estimate the amount of adsorbed moisture and arrive at the true weight of the LCarb and NP powders.

As has been pointed out previously (P. F. Bordui, U.S. Pat. No. 5,310,448 (1994)), isotope corrections for lithium and impurity content may also be taken into account. In an alternate implementation, the supplier's provided moisture content is used to calculate what the powder weights should be. If none of these options are available, one can assume the powders consist of only the pure compound. The powders are weighed at the pre-determined mass ratio of LCarb to NP, $\zeta_0$. For pure compounds, assuming a natural Li isotopic ratio, we use molar mass values of 73.8932 g/mol for LCarb and 265.8098 g/mol for NP, resulting in $\zeta_0$=0.26054 for the assumed congruently melting composition with 48.38 mol % $Li_2O$. The amounts weighed out and mixed need to be large enough to grow a crystal representative for the targeted growth process. It is possible to mix large amounts of powders at this stage, and only use a small fraction of the mixture for the test crystals while putting aside the rest of the mixing charge. Once a corrected value for $\zeta_{cor}$ is determined (step 150), more LCarb (to increase $\zeta$ over $\zeta_0$) or NP can be increased (to decrease $\zeta$) to the large amount of powders so that the desired corrected weight ratio is achieved. In most cases, growing one test crystal is sufficient. The uncertainty in weighing errors are typically small compared to the measurement errors in step 140. If, however, the weighing or mixing process induces significant variability in the melt compositions produced for a given powder lot and weighing recipe, several crystal growths may be needed. This can occur, by way of illustration and without limitation, from operator error (powders used, tare errors, calculation or keyboarding errors), equipment malfunction and the like.

As indicated in step 158, such errors should become clear once the correction in the weighing recipe is calculated. A statistical process control (SPC) chart for example may trigger a suspicion such an error has occurred, and this will result in one or more test crystal to be grown to either confirm the large correction calculated to be correct, or in pointing out the erroneous result of the first test crystal in which case its results will be disregarded. Once the test crystals are grown, the crystal composition, relative to congruent crystals, needs to be measured. A highly accurate method is much desired. Curie temperature measurements either by differential thermal analysis (DTA), dielectric measurement, or a lattice constant measurement by X-ray using the Bond method can be employed. An alternate method that can generally be applied to any SAW material is to manufacture SAW devices on some test wafers taken from the test crystal and characterizing some frequency characteristic of the device. This method has the advantage of being directly relevant to the end user, and of being highly accurate given a good test structure SAW design, but it is more labor intensive than other methods that may thus be preferred. The number of samples measured and the approximate location where those samples are taken from the crystal will depend on the measurement uncertainties in the composition measurement and those in solidified fraction estimation.

Step 155 in the method serves to estimate the starting melt composition from which the one or several test crystal(s) is grown, using the input of sample solidified melt fraction and measured composition in step 140. This model can be a full simulation of the crystal growth as described below, or it can be a simple correlation derived from experiments of previously grown crystals. The weighing recipe correction will be very accurate, resulting in crystals with narrow SAW velocity distribution, provided that the melt has small enough, that is negligible volatilization. In one implementation of the present invention, the method in step 155 may only require a correction to the initial weighing factor if the test crystal samples deviate from congruency by more than a predetermined threshold. Whatever the method, a crystal sample measurement richer in lithium oxide than a congruent sample will result in a starting melt composition estimate that is also richer in lithium oxide. It may take into account the various errors in measurements, and determine the influence (sensitivities) of these errors on the estimated starting melt composition. If multiple samples were evaluated in step 140, the resulting melt composition estimates (one for each sample) should be averaged with a weighing function that inversely depends on the uncertainty for each of the estimates to arrive at the best estimate for the starting melt composition $x_l(0)$.

The corrected weighing recipe ratio $\zeta_{cor}$ is calculated as described below from the recipe ratio $\zeta_0$ used to produce the melt at estimated composition $x_l(0)$.

Model to Predict Crystal Composition

In one embodiment of the present invention, the model of step 155 allows accurate calculation of the crystal composition for a wide range of solidified melt fractions and starting melt compositions. The composition of LN typically is described by the molar fraction x of $Li_2O$ $$x = \frac{A}{A+B} \quad (1)$$

where A and B are the number of moles in the sample volume of $Li_2O$ and $Nb_2O_5$, respectively. A lithium-rich melt of composition $x_l > x_c$ will grow a crystal also richer in lithium than congruency. As the solidification progresses, the growing crystal rejects $Li_2O$ leading to a progressively increasing $Li_2O$ content in the melt and resulting crystal. While the phase-diagram describes equilibrium conditions, LN crystals are grown at rates of several millimeters per hour, and the dynamics of the boundary mixing layer needs to be taken into account. Because the growth conditions such as pull rate, convection velocity, axial and radial temperature gradients are typically held constant for a given growth system, it is customary to define an effective distribution coefficient that relates the melt composition $x_l$ to the presently grown crystal composition $x_s$:

$$k_{eff} = \frac{x_s}{x_l}. \quad (2)$$

This effective distribution coefficient equals one at the congruent composition irrespectively of growth speed or crystallization direction, but deviates from that value for other compositions. To facilitate modeling of compositional changes during growth, the function $k_{eff}(x_l)$ is expanded in a Taylor series around the congruency point:

$$k_{eff}(x_l) = 1 + a(x_l - x_c) + b(x_l - x_c)^2 + c(x_l - x_c)^3 + \quad (3)$$

This equation forms the basis to calculate the crystal composition during growth as a function of starting melt composition. From an experimental point of view, it is easier to measure the weight than count the number of atoms in a crystal. The weigh fraction equivalent of equations (1) and (2) is defined as:

$$\mu = \frac{A \times m_{Li_2O}}{A \times m_{Li_2O} + B \times m_{Nb_2O_5}} = \left\{ 1 + \left( \frac{1}{x} - 1 \right) \times \left( \frac{m_{Nb_2O_5}}{m_{Li_2O}} \right) \right\}^{-1} \quad (4)$$

$$\kappa = \frac{\mu_s}{\mu_l} \quad (5)$$

where m denotes the molar weight of the respective oxide compound. With the molar weights $m_{Nb_2O_5} = 265.8098$ and $m_{Li_2O} = 29.8834$, equation (4) provides a means for conversion between the mass fraction and the molar fraction description of the crystal or melt composition. Let us now consider a growing crystal started from a melt of mass M with composition $x_l(0)$. The solidified fraction g is defined as the grown crystal mass divided by M. As the growth proceeds, the melt and crystal composition will vary with g. Assuming negligible volatilization, no diffusion in the solid phase and complete mixing in the liquid phase, giving a uniform concentration in the liquid; the sum of crystal mass and remaining melt is constant as is the total weight content of Li2O. This conservation of Li2O mass can be expressed as $$\int_0^g \mu_s(g')\,dg' + (1-g)\times\mu_l(g) = \mu_l(0). \qquad (6)$$

The left hand side of equation (6) is the sum of the weight fraction of $Li_2O$ in the solidified crystal and the $Li_2O$ contained in the remaining melt with composition $x_l(g)$. The right hand side is the $Li_2O$ weight fraction of the original melt, calculated by inserting the melt composition into equation (4). Equation (6) is an implicit expression for the crystal (or melt) composition as a function of the solidified fraction g and the starting melt composition. If the mass distribution coefficient κ were constant, this equation would simplify to $$\int_0^g \mu_s(g')\,dg' + \frac{(1-g)}{\kappa}\times\mu_s(g) = \mu_l(0), \qquad (7)$$

with solution $$\mu_s = \mu_l(0)\times\kappa(1-g)^{\kappa-1}. \qquad (8)$$

This result is the well known Scheil-Pfann equation. For the system studied here however, κ is concentration dependent and equation (6) is to be solved numerically.

MODELING EXAMPLE 1

Off-Congruent Growth

Eleven crystals were grown from starting melt compositions ranging from 47.46% to 49.30%, shown in Table I. The starting powders were weighed, mixed, and reacted before loading 7 kg of the reacted material into the crucible. Varying moisture content, powder purity and $Li_2O$ content within the carbonate powder can lead to deviations from the desired composition as calculated from the molar weights. To account for this, a weight correction factor was used such that a calculated composition of 48.380% resulted in mixtures giving rise to crystals of uniform composition. Accurate correction factors were determined by carrying out moisture tests on the LCarb powder and growing a test crystal, using the same powder lots as those used for the experimental crystals, and verifying the test crystal uniformity by Curie temperature measurements. If a difference was measured in Curie temperature between the top and bottom samples, the correction factor was adjusted accordingly and a further test crystal grown. Typical correction factors ranged from 1.0022-1.0029. Using this procedure, the starting melt composition values are accurate relative to the congruent composition to about 0.01%.

Growth was initiated using seeds oriented along the (10.4) orientation, also known as 128° RY orientation in the SAW community. After coning the diameter to between 105 and 108 mm, the growth rate was kept constant and the heating power was adjusted to control the diameter. In order to maintain good control over the solidified fraction, the pull and rotation rates were adjusted to produce a flat growth interface. Growth was terminated by separating the crystal from the melt, followed by an annealing step, cool-down and harvest. The first nine crystals shown in Table I had a growth rate of about 5 mm/h. To investigate the freezing rate dependence of $k_{\it{eff}}$, two more crystals were grown at rates twice and three times that used for the other crystals.

TABLE I

Starting melt compositions and resulting crystal properties

| Starting melt composition | Crystal weight (g) | Number of samples | Range of g for samples | Range of $T_c$ measured (° C.) | Notes |
|---|---|---|---|---|---|
| 47.460% | 6500 | 10 | 7.8-84.2% | 1095.9-1131.7 | Growth |
| 48.100% | 6298 | 8 | 16.2-88.3% | 1125.9-1139.4 | speed |
| 48.170% | 6334 | 9 | 7.7-87.5% | 1132.8-1140.1 | 1X |
| 48.240% | 6440 | 9 | 9.3-89.7% | 1131.9-1140.2 | |
| 48.300% | 6290 | 8 | 8.6-87.8% | 1136.0-1140.8 | |
| 48.450% | 6473 | 9 | 8.5-90.5% | 1142.3-1148.0 | |
| 48.500% | 6405 | 9 | 7.1-90.4% | 1143.8-1149.9 | Data used in fits A-C |
| 48.600% | 6438 | 9 | 9.6-88.9% | 1144.8-1153.4 | |
| 49.300% | 6152 | 10 | 4.3-83.2% | 1151.8-1175.4 | |
| 48.959% | 5941 | 5 | 5.1-71.4% | 1148.2-1158.0 | Speed 2X fits D, E |
| 48.959% | 5827 | 3 | 13.3-35.0% | 1149.4-1151.6 | Speed 3X fits D, E |

MODELING EXAMPLE 2

Composition Measurements

The grown crystals were weighed and then sliced. Multiple cuts were made on a diamond saw generally yielding 8 to 10 slices for each crystal with thickness between 1.0 and 1.5 mm, separated by thicker slabs. The cutting planes were aligned to the bottom face to ensure that each slice represented a well defined solidified fraction ratio g. All the slices and slabs were weighed, the kerf loss weight was estimated, and the average solidified fraction value for each slice determined. The dominant uncertainty in estimating the correct solidified fraction for a sample stems from deviations of the cut plane from the growth interface at the time of solidification, either due to non-planar growth interface or due to saw-cut misalignment. The combined effects are estimated to introduce an error of no more than ±2%. The two crystals with the most extreme melt compositions as well as the crystals with increased growth rate exhibited sections towards the bottom where cellular growth was observed, presumably due to constitutional super-cooling.

No samples were cut from these regions, limiting the range of evaluated solidified fractions for these crystals. From each of the slices, a sample measuring about 15×15×1.5 mm$^3$ was cut from the central region of the crystal to avoid skin-effects and then evaluated using the Curie temperature measurement apparatus described previously. Two S-type thermocouples each were in contact with the top and bottom platinum electrodes contacting the sample to measure capacitance. A measurement consisted of two heating and cooling cycles at ramp rate of 1.6K/min. The thermocouple temperatures were recorded for which the capacitance peaked, and all recorded temperature measurements were averaged to give the Curie temperature measurement value. As the thermocouples are not calibrated, the absolute accuracy is less than 4K. However, the run to run reproducibility is around ±0.4K.

The same apparatus is used in ongoing crystal growth quality control and is calibrated by adjusting the offset such that the Curie temperature of congruent crystals (uniform top to bottom) reads 1142.3° C. This calibration is done whenever there is a noticeable deviation, around 0.3K, or if one or all of the thermocouples are exchanged. In the neighborhood of the congruent Curie temperature, the apparatus is well calibrated relative to that temperature and gives excellent reproducibility. For samples that significantly deviate from the congruent composition, the apparatus is operated further away from its optimal range and the measurements are less accurate. For the data analysis, the uncertainty in Curie point temperature measurement is approximated by:

$$\sigma = \sqrt{(0.4K)^2 + (0.05 \times [T_{meas} - 1142.3°C.])^2}. \quad (9)$$

Data Analysis and Discussion of Model Parameters

To solve equation (6) numerically, it is brought into a form that can be integrated. Both the compositions of the solid and liquid are functions of g. The partial derivative with respect to g and insert (5) is taken to arrive at $$\mu_s - \mu_l + (1-g) \times \frac{\partial \mu_l}{\partial g} = (\kappa - 1) \times \mu_l + (1-g) \times \frac{\partial \mu_l}{\partial g} = 0. \quad (10)$$

The effective distribution coefficient κ depends on the melt composition and can be calculated using (2)-(5). After re-grouping the terms, the following is derived:

$$\frac{\partial \mu_l}{\partial g} = \frac{1 - \kappa(\mu_l)}{1 - g} \times \mu_l. \quad (11)$$

Equation (11) represents a first order partial differential equation that can easily be integrated for the melt composition evolution using the Runge-Kutta algorithm. To convert the experimental Curie temperature measurements to crystal composition, the relationship derived previously is used $$x_s = 48.38\% + \frac{(T_{meas} - 1142.3°C.)}{39°C.}\%. \quad (12)$$

With the present invention, this experimental data is used to derive coefficients for equation (3) that most faithfully describe the crystal composition evolution. The integration algorithm can be used to calculate the resulting crystal parameters for a given set of coefficients a, b, c, $x_c$. To optimize the value of these parameters, the nonlinear Levenberg-Marquart routine with numerically calculated derivatives. This fitting method optimizes the values of the fit parameters in order to minimize the mean squared error for all N data points included in the fit, defined as $$mse = \frac{1}{N} \sum_{i=1}^{N} \left( \frac{T_C^i(\text{model}) - T_C^i(\text{experiment})}{\sigma^i} \right)^2. \quad (13)$$

The measurement uncertainty for each data point i is used to ensure that less precise data points carry less weight than others. The uncertainty of the measured temperature due to apparatus limitations in equation (9) was estimated, and the uncertainty in solidified fraction estimates and the error in estimating the starting melt composition was considered. The influence of both variables on the resulting Curie temperature was estimated by running growth simulations with slightly varied values of g and $x_i(0)$. These sensitivity calculations were carried out after every iteration. In the early stages of fitting when the values of the fit coefficients are not well defined, the estimated uncertainty may be erroneous, but as the fit converges, the error estimation also converges. The Curie temperature uncertainty for equation (13) is thus given by adding two terms to equation (9) and inserting the numerically calculated derivatives for each data point $$\sigma = \sqrt{(0.4 \text{ K})^2 + (0.05 \times [T_{meas} - 1142.3° \text{ C.}])^2 + \left(2\% \times \frac{\partial T_C}{\partial g}\right)^2 + \left(0.01\% \times \frac{\partial T_C}{\partial (x_l(0))}\right)^2}. \quad (14)$$

The uncertainties in the fit results were estimated by multiplying the fit parameter co-variance elements with the mse of equation (13) and then taking the square root. A fit model that truthfully describes the experiment will result in an mse value around one. The goal of the fitting procedure is to accurately describe the observed data with as few parameters as possible. Table II shows the results of the fitting runs. The first three, fitting runs A through C, were conducted using the 81 data points gathered from the first 9 crystals. A parameter where the uncertainty is indicated was fitted, otherwise it was held constant. For fitting run A, only the linear parameter a in equation (3) was adjusted and the others were set to zero or kept constant. The agreement is reasonably good with mse=1.17 and the parameter converged well to three significant digits. For fit run B, the quadratic term b was also adjusted by the program, allowing for a more complex shape of boundary in the phase-diagram, slightly reducing the mse. The higher order terms in equation (3) are influenced most heavily by the high solidified fraction data points of the two compositions furthest away from congruency. Considering that the uncertainty for these points stems mostly from systematic influences, temperature measurement errors and initial melt composition errors, it can not be asserted from the results of run B that the parameter b differs significantly from zero. Including the cubic term c in the fit resulted in no further improvement of the mse and an estimated parameter uncertainty exceeding its value. The linear model assumed in fit run A therefore is sufficiently accurate to describe the data given the experimental errors. For fit run C, the congruent composition was adjusted in addition to parameter a. There is no significant improvement of the mse, and the optimized congruent composition agrees well with the assumed congruency of 48.380%. Note that this value does not determine the congruent composition absolutely, but confirms that the procedure used for establishing LCarb weight correction factors achieves its aim of giving reproducible melt compositions resulting in uniform crystals of congruent composition.

TABLE II

Fit results for parameters of equations (3) and (15)

| Parameter | Run A | Run B | Run C | Run D | Run E |
|---|---|---|---|---|---|
| a | −1.485 ± 0.009 | −1.488 ± 0.009 | −1.484 ± 0.009 | −1.477 ± 0.008 | −1.511 ± 0.020 |
| b | 0 | 1.09 ± 0.67 | 0 | 0 | 0 |
| $x_c$ | 0.4838 | 0.4838 | 0.48379 ± 0.00003 | 0.4838 | 0.4838 |
| (δ/D) | N/A | N/A | N/A | 0 | 0.0037 ± 0.002 |
| mse | 1.17 | 1.13 | 1.17 | 1.15 | 1.11 |

Figure 2:
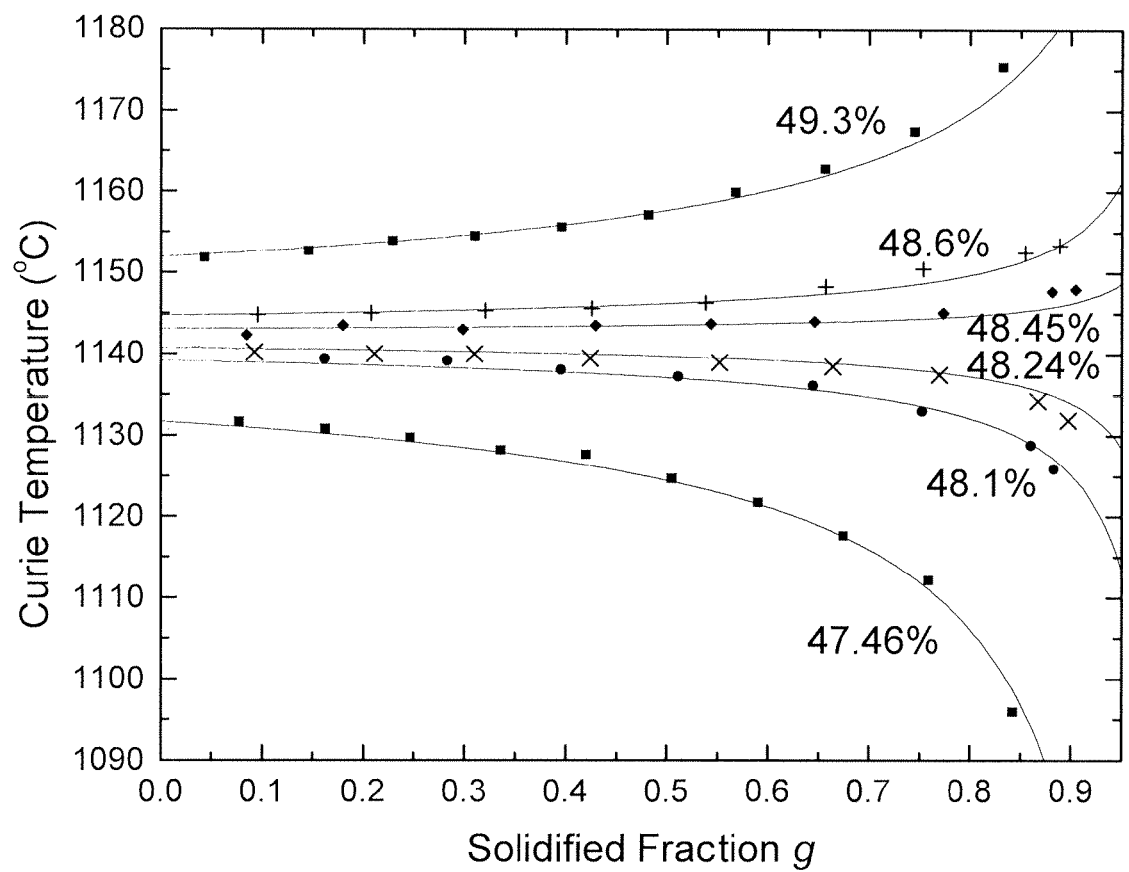
FIG. 2 is a graph illustrating experimental data points for six LN crystals together with simulation results.
Figure 3:
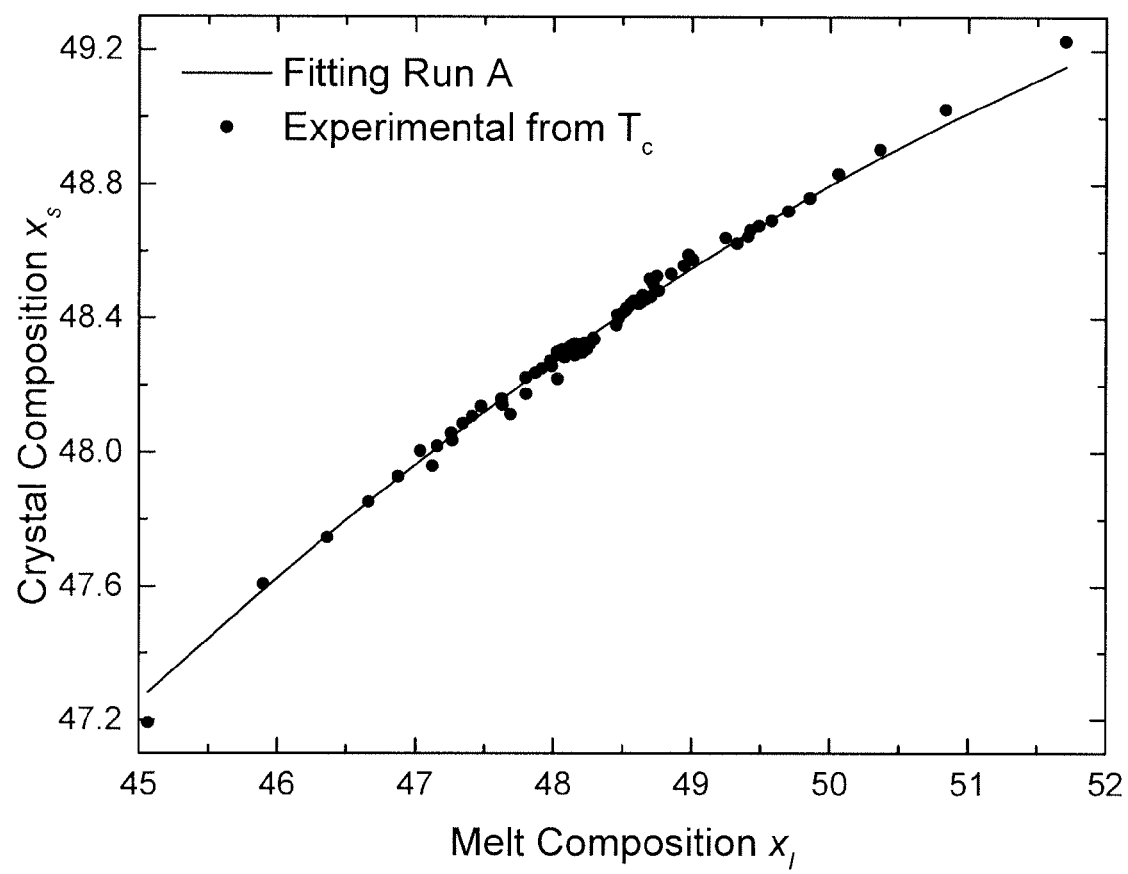
FIG. 3 is a graph illustrating LN crystal composition as a function of starting melt composition and solidified melt fraction.

FIG. 2 shows the measured Curie temperature data for six of the nine crystals together with the calculated results using the fit results of run A. The curves are labeled with the starting melt composition. The data for the remaining three crystals, while included in the data set for run A, have been omitted to avoid overcrowding of the plot. As expected, $Li_2O$ rich melts will grow crystals also rich in $Li_2O$ with Curie temperatures above the value 1142.3° C. corresponding to a crystal of congruent composition. The deviation from congruency increases as the solidified fraction increases. There is reasonable agreement between simulated results and experimental data. FIG. 3 shows the crystal composition for all samples taken from the nine crystals grown from melts covering the composition range investigated. The circles show the crystal composition, calculated from the Curie temperature measurement (equation (12)) as a function of the estimated melt composition based on the starting melt composition, the solidified fraction, and the fitting run A parameters. The melt composition ranges from 45.1% to 51.7% resulting in crystal compositions ranging from 47.3% to 49.2%. The solid curve which is closely tracking the experimental results was calculated from equation (2) with the results of fitting run A. While the effective distribution coefficient depends linearly on the melt composition, the grown crystal composition is the product of the distribution coefficient and the melt composition and thus is described by a parabolic arc segment. The equivalent curve in FIG. 5 of reference (J. R. Carruthers, G. E. Peterson, M. Grasso, P. M. Bridenbaugh, J. Appl. Phys. 1971, vol 42, 1846-1851) agrees well with this result except for the offset in assumed congruency. Considering the large variation in pull rates, ranging from 3.8 mm/h to 10 mm/h, and crystal diameters ranging from 20 mm to 100 mm in these studies, the good agreement indicates that all growth conditions are close to equilibrium where the difference between effective and equilibrium distribution coefficient becomes negligible. To investigate how closely the actual growth conditions approximate equilibrium conditions, samples from two more crystals, grown at increased speed, were analyzed. Following the treatment outlined by BPS (A. A. Wheeler, *Journal of Crystal Growth*. 1989, vol. 97(1), 64-75), the effective distribution coefficient can be expressed as a function of the equilibrium distribution coefficient $k_0$, the boundary layer thickness δ, the solute ($Li_2O$) diffusivity D, and the crystal growth rate $v_g$ as:

$$k_{eff}(x_l, v_g) = \frac{k_0}{k_0 + (1-k_0) \times \exp(-(\delta/D)v_g)}. \quad (15)$$

$$k_0(x_l) = 1 + a(x_l - x_c) + b(x_l - x_c)^2 + \ldots$$

With the introduction of an additional fit parameter δ/D, which can be assumed to be constant for a given growth system, all 89 data points from the eleven crystal growth runs can be fitted.

Figure 4:
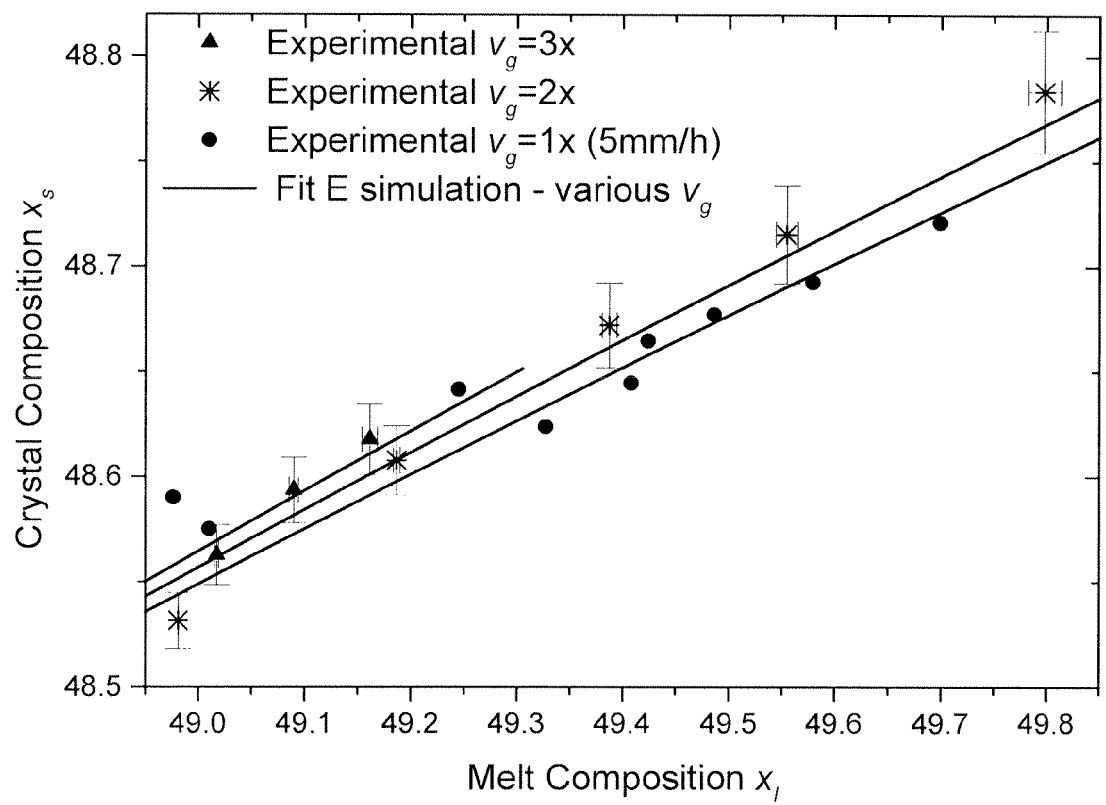
FIG. 4 is a graph illustrating LN crystal composition as function of melt composition in a selected range showing results for three different growth rates as compared to simulation results.

Fitting run D assumes a linear dependence of $k_0$ on the melt composition and forces the parameter δ/D to vanish. This condition sets the effective distribution coefficients to be equal to the equilibrium coefficients for all growth conditions. Good agreement is achieved, even lowering the mse below that of fitting run A, indicating that the 8 additional data points have lower random errors than those used for fitting run A. It also suggests that all the crystals grown have boundary layer kinetics close to equilibrium conditions. To get a quantitative result, fitting run E was allowed to adjust both parameters a and δ/D. The fit converged well with the results indicated in Table II. The boundary layer kinetics parameter is estimated at δ/D=0.0037±0.002 h/mm. This value is close to zero, explaining why fitting run D gave reasonably good agreement. Note that while the parameters a, b, c, $x_c$ are expected to be dependent only on the crystal material, the parameter δ/D is expected change with variations in growth furnace configuration. A higher rotation rate for example will increase the convective flow speed, decreasing the layer boundary thickness δ. FIG. 4 shows a close-up of the solid vs. liquid composition region with the measured crystal samples for the different growth rates. The small solid circles are for the nominal growth rate and are identical to those of FIG. 3. The additional data points are for samples grown at twice the speed (large solid circles) and at three times the speed (open circles). The solid curve is calculated from fitting run E results inserting the lowest growth speed and it is indistinguishable from a curve calculated from fitting run A results. The faster grown crystal samples are shown with error bars: The y-axis error corresponds to the temperature measurement error calculated from Equations (12) and (14). Because the melt composition for the experimental points is based on a simulation, it is fit dependent and the x-axis error bar indicates the variation when using fitting run D or E parameters. The dash and dash-dotted lines show the fitting run E results for twice and three times the growth speed, respectively. The deviation from equilibrium condition is of the same order of magnitude as the experimental errors, but the model accuracy overall is improved as is evidenced by the decrease in mse over that of fitting run D.

Summary of Results for Model to Predict Crystal Composition

Eleven LN crystals were grown from melts deviating from the congruent composition. The Curie temperature was measured for samples cut from the crystals at various solidified fractions in order to determine the sample composition. A model to predict axial compositional variations during growth was developed and the data was used to estimate the effective distribution coefficient as a function of melt composition and growth speed. The composition of the measured crystal samples corresponding to melt compositions ranging from 45.1% to 51.7% $Li_2O$ could be predicted well by assuming a linear relationship between the melt composition and the equilibrium distribution coefficient: $k_0=1-1.511\times[(x_l-x_c)/100\%]$. For the growth conditions investigated, the effective distribution coefficient, calculated using the BPS model, resulted in shifts smaller than 0.1% from the equilibrium distribution coefficient. The achieved agreement over the whole range of compositions investigated confirms the validity of the assumptions, namely negligible volatilization, complete melt mixing and negligible solid diffusion. Knowing the initial melt composition and the solidified melt fraction for a crystal growth run allows the calculation of crystal composition and resulting physical characteristics for wafers cut from that crystal. The functional form of $k_{eff}(x_l, v_g)$ was derived for a certain set of growth conditions (growth of 108 mm diameter crystals at growth rate 5-15 mm/h and initial melt weight of 7 kg). While reasonably accurate predictions are possible by using fitting run A parameters and thus neglecting deviations from equilibrium, the predictability of the model improves if an estimate of the experimental parameter δ/D is first obtained for the growth system to be modeled. This can be done by growing and analyzing at least two off-composition crystals at different speeds. Our growth system has been optimized for large diameter crystal growth at large melt-fraction conversions with minimal cracking. Other crystal growth furnaces that produce large, industrial quality crystals will have fairly similar growth parameters, also satisfying the near-equilibrium condition. Consider a crystal with composition at the boundary of the useful range of composition, e.g. with a Curie temperature shift of +5K. Such a crystal would require a melt composition $x_l$=48.87% assuming equilibrium growth conditions, or $x_l$=48.79% under very fast growth of around 20 mm/h. The corresponding effective distribution coefficient would differ by less than 0.2% from the calculated equilibrium value. As the LN crystal users are increasing wafer diameter to 150 mm and beyond, it is expected that the necessary crystal growth systems refinements move the process even closer to equilibrium conditions to avoid strain-induced cracking. The model presented here with the fitting run E results will allow theoretical modeling of the achievable crystal uniformity. Good agreement is also achieved by neglecting the growth speed and using fitting run A results shown in Table II.

Calculating Corrected Weighing Recipe Factors

The sample solidified melt fraction cut from the test crystal(s) and measured composition values for those samples are assumed measured in step 140. As illustrated in a comparative example below, the uncertainties in those composition values are taken into account to estimate the starting melt composition $x_l(0)$ used to grow the test crystals. We denote this estimate by $x_{est}$. The test crystal melts were produced using weighing recipe ratio $\zeta_0$ as described above. The goal is to adjust the ratio so that the starting melt composition satisfies $x_l$=48.38%. The corrected recipe ratio is calculated as:

$$\zeta_{cor} = \frac{0.4838}{1 - 0.4838} \times \frac{1 - x_{est}}{x_{est}} \times \zeta_0 = 0.93723 \frac{1 - x_{est}}{x_{est}} \times \zeta_0. \quad (16a)$$

For comparison, a prior art approach that determines the corrected weighing recipe by taking into account drying correction factors for the two powders would calculate the corrected factor from the theoretical molar weights and the two moisture correction factors, taken to be 1.0058 for the LCarb and 1.0002, as in one of the prior art publications, yields the following weighing recipe.

$$\zeta_{PriorART} = \frac{CF_{LCarb}}{CF_{NP}} \times \zeta_{theoretical} = \frac{1.0058}{1.0002} \times 0.26054 = 0.26200. \quad (16b)$$

EXAMPLE 1

Powders from two different NP vendors and four different LCarb vendors were evaluated over multiple years. Over 100 test crystals were grown in that time period for various combinations of supplier lots, and corrected weighing recipes were established according to step 150. Two samples from each test crystal were typically evaluated, one from the top, one from the bottom of the crystal, and the average of these results was used to estimate, when needed, a corrected weighing recipe factor $\zeta_{cor}$. The samples were cut from the bulk of the crystal to avoid measuring material very close to the crystal surface that may have lost some lithium oxide via an out-diffusion mechanism during growth and annealing steps. The correction was based on a linear rule of thumb that gave a correction proportional to the deviation of the average sample Curie temperature from 1142.3° C. This model to predict the effects of $Li_2O$ segregation does not take into account the varying solidified fraction of either the top or bottom sample. Nonetheless, it gives a fair approximation for the correction needed, particularly if only a small correction is needed from the first guess recipe factor $\zeta_0$.

In an alternate implementation of the present invention, a corrected recipe factor is only calculated if the composition deviation from congruency in the test crystal samples exceeds a predetermined threshold. In cases where a large correction was necessary, a second test crystal was grown, using the corrected recipe, and a second iteration of the process was used, giving the final corrected weighing recipe factor $\zeta_{cor}$.

Figure 5:
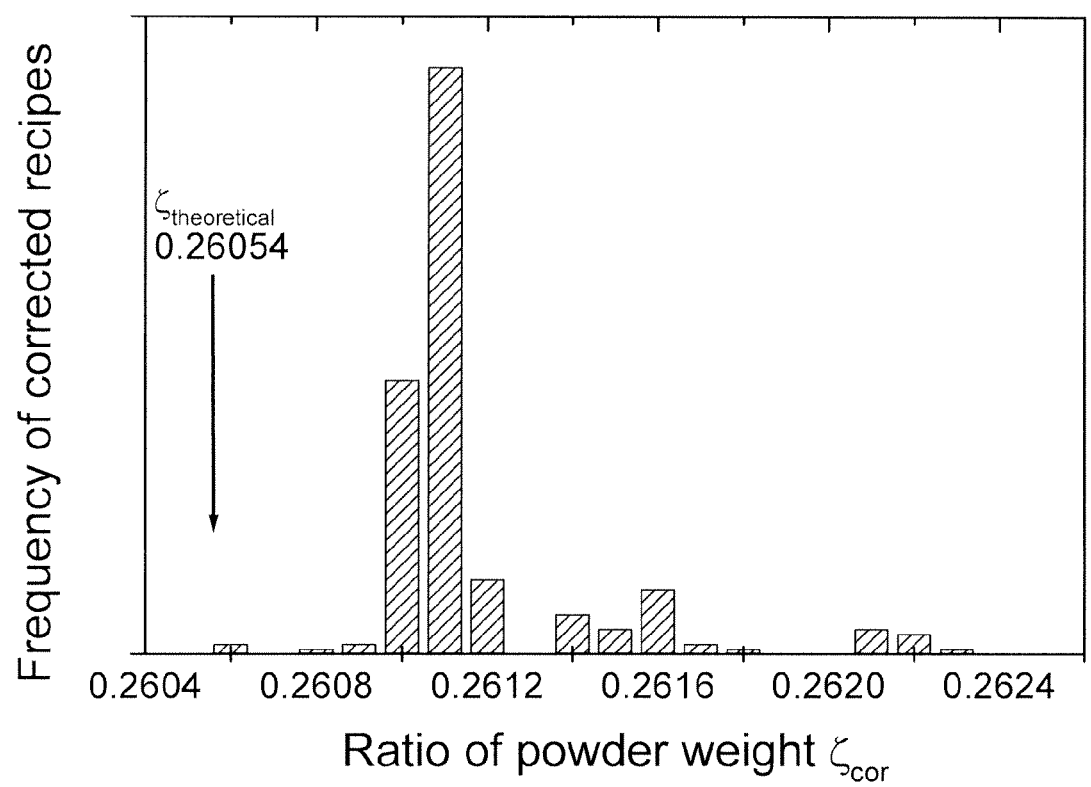
FIG. 5 is a histogram illustrating the frequency and range of corrected recipes calculated from over 100 test crystals.

FIG. 5 is a histogram of the weighing recipe factors and illustrates the range and frequency of final recipe factors that was necessary to grow crystals with good uniformity and a narrow range of SAW properties. It can be seen that the values group in clusters, indicating that the different manufacturing methods used by the various vendors of the raw materials have a major impact on the moles of lithium or niobium in the powders per gram of powder. The correction from the theoretical value is as large as 0.68%. During this work, it was found that the drying tests performed on the powders would not accurately predict the correction needed, supporting the suspicion that drying tests do not adequately account for dissociation and/or incomplete moisture removal.

EXAMPLE 2

To illustrate how the model developed above may be used to estimate the starting melt composition, the dataset measured was used as part of the study mentioned above. In most cases, it is not necessary to measure as many samples (9 in this example for a melt composition 48.50%) per test crystal, but we use them all here to show how the sensitivity estimates can be used to derive weighing factors in order to arrive at the best overall guess of the starting melt composition. Table III reproduces the measured data together with the estimated fractional melt conversion values for the samples. This crystal was grown at 5 mm/hr with a maximum fractional melt conversion of 90.4%. Because of shape irregularities and dicing kerf loss when cutting the test samples, there is some uncertainty in estimating the fractional melt conversion g. We estimated this to be ±2% for all samples. For the Curie temperature measurements, we assume a random error of ±0.4K for each sample. With some refinement in the measurement methods, these errors can be reduced, with resulting improvement in the estimate of starting melt composition and weighing recipe factor correction.

TABLE III

Curie data measured and estimation of starting melt composition

| Fractional melt g | Curie Tc | $x_i$ | $\frac{\partial x_i}{\partial g}$ | $\frac{\partial x_i}{\partial T_c}$ | weight | weight × $x_i$ |
|---|---|---|---|---|---|---|
| 7.1% | 1143.84 | 48.514% | −0.00103 | 0.088% | 7.2% | 3.47% |
| 21.0% | 1144.26 | 48.532% | −0.00138 | 0.078% | 8.0% | 3.88% |
| 31.1% | 1144.36 | 48.525% | −0.00151 | 0.071% | 8.8% | 4.27% |
| 43.1% | 1144.74 | 48.529% | −0.00189 | 0.062% | 10.0% | 4.86% |
| 55.2% | 1145.07 | 48.523% | −0.00230 | 0.052% | 11.7% | 5.68% |
| 67.2% | 1145.78 | 48.524% | −0.00316 | 0.042% | 13.9% | 6.76% |
| 77.2% | 1147.01 | 48.531% | −0.00477 | 0.033% | 15.5% | 7.51% |
| 88.8% | 1149.25 | 48.515% | −0.00869 | 0.020% | 13.1% | 6.36% |
| 90.4% | 1149.91 | 48.513% | −0.00999 | 0.018% | 11.8% | 5.73% |
| | | | | Overall best estimate for $x_i(0)$ | | 48.52% |

An alternate way to reduce the uncertainty in the Curie temperature measurements is to cut several samples from a given location, thus having the same composition, and performing consecutive measurements on those samples. The standard error of n measurements then is reduced over a single measurement by the square root of n. Four measurements will cut the standard error in half.

The algorithm above using an RK method allows calculation of the crystal composition and therefore the Curie temperature from the fractional melt value, the starting melt composition, and the growth speed, using Fit result parameters E. A root finder routine (e.g. Newton-Raphson using numerical differentiation) gives us the desired inverse function that calculates the estimated starting melt composition $x_i$ for each sample, given the inputs fractional melt value, growth speed, and Curie temperature. The results are also shown in the table. Calculations of changes in estimated melt value as a function in variations in input parameters are also straightforward. These sensitivities are shown in columns 3 and 4 of Table III. By using a normalized weighing function that is inversely proportional to the root of the squared errors according to $$\text{weight} \propto 1 \Big/ \sqrt{\left(2\% \times \frac{\partial x_i}{\partial g}\right)^2 + \left(0.4\,\text{K} \times \frac{\partial x_i}{\partial (T_C)}\right)^2}, \quad (17)$$

the overall best estimate for the starting melt composition $x_i(0)$ can be calculated as the sum of the products of weights with individual estimates $x_i$. In can be seen that for the uncertainties in measurements assumed, the measurement at g=77.1% is most heavily weighted. Samples at earlier stages of growth have more uncertainty from the Curie point measurement, and those with higher fractional melt conversions have more uncertainty stemming from the uncertainty in fractional conversion estimates for the samples. Furthermore, basic error propagation assuming uncorrelated errors lets us find an estimate for $x_i(0)$ from the weights in Table III and the uncertainties for each individual melt estimate $x_i$ according to $$\Delta x_i(0) = \sqrt{\sum (\Delta(\text{weight} \times x_i))^2} = \sqrt{\sum \text{weight}^2 \times (\Delta x_i)^2}. \quad (18)$$

Inserting the values of Table III into equation (18) provides an estimated uncertainty of ±0.0075% in the estimate for $x_i(0)$. It is clear from those results that a change in sample testing which changes the uncertainties of either the fractional conversion estimate or the Curie temperature measurement will shift the location of the sample of most importance for the end result. It may be particularly rewarding to improve the fractional conversion uncertainty estimate for the sample cut from the bottom of the crystal. This could be done by minimizing the sample thickness and taking the sample from the center of the crystal having a slightly convex growth interface. Recent improvements in sample preparation, sample placement in the dielectric method Curie furnace and furnace ramp control have resulted in reproducibility improvements in Curie temperature measurement to yield about $\Delta T_c = 0.1$K.

EXAMPLE 3

In this illustrative example, the expected distribution of SAW properties is calculated for a large population of crystals grown from various recipes that have been corrected according to the present invention. The accuracy of the sample composition measurement depends on the details of the measurement method, and several cases are discussed here with the corresponding influence on the distribution of the composition of the SAW substrates. The most common measurement method to estimate the composition is the Curie temperature either by dielectric method, or by DTA. As described in the detailed description above, the apparatus used had an estimated uncertainty (one sigma value) of ±0.4K. To estimate the importance of an accurate composition measurement, the calculations were also performed for Curie temperature measurement apparatus having a lower accuracy of ±0.8K for measuring congruency deviations. The model for estimating the initial melt composition not only depends on the composition estimates of the samples, but also on the estimate of the fractional melt conversion for the samples. We assume here that this estimate is accurate to ±2%. To study how much the present invention can improve by more carefully control the measurement uncertainties, a simulation was also performed for assumed Curie temperature uncertainty of ±0.2K and fractional melt conversion uncertainty of 1%, values that are reachable by careful maintenance and calibration of the measurement apparatus. In the simulations of the present invention done for this example, the uncertainties for the Curie temperature and the fractional melt conversion estimates of the samples was assumed to be characterized by a Gaussian distribution (also called a Normal distribution) around the true value, using the assumed uncertainties as distribution controlling parameters. While it is possible to cut only one sample for a test crystal, we assumed in this example that two samples would be cut from each test crystal grown from the initial weighing recipe characterized by $\zeta_0$. Without limiting where the crystal test samples are cut from the test crystal, we assume for the purpose of this example that two crystal samples are to be cut at 7% and at 80% of fractional melt conversion. Samples at very low fractional melt conversions, where the crystal has not reached full diameter, are best avoided because the small crystal diameter during that stage of growth does not ensure complete mixing of the melt. In practice, samples could be taken after the crystal has been cropped and sliced, using the topmost and the bottommost slice or any samples in between. We expect that the initial weighing recipe factor will need to be corrected with a number on the order of half the range shown in FIG. 5. For simulation purposes, we assume that the correction required for each new recipe has a uniform distribution in the range −0.001 and +0.001. Absent any measurement errors, these limits equate to a shift in Curie temperature for the 80% solidified fraction samples of about ±4K. An SPC procedure as provided for in step 158 requires a repeat for test crystals if any sample exceeds a threshold value, assumed to be ±4K for this example, from the value expected for a true congruent sample. Two effects can contribute to this SPC rule violation: First, the required correction for the powder weighing ratio may be close to the assumed limits, and a nominal measurement error adds to exceed the SPC limit. A repeat growth will then yield similar results, confirming that a fairly large correction is necessary. The other contribution to an SPC violation is the measurement errors that in some cases can be several standard deviations. A repeat growth and analysis in this case will determine a smaller recipe shift necessary. This SPC procedure overall has the effect to reduce the wings in the Gaussian distribution for measurement errors.

Figure 6:
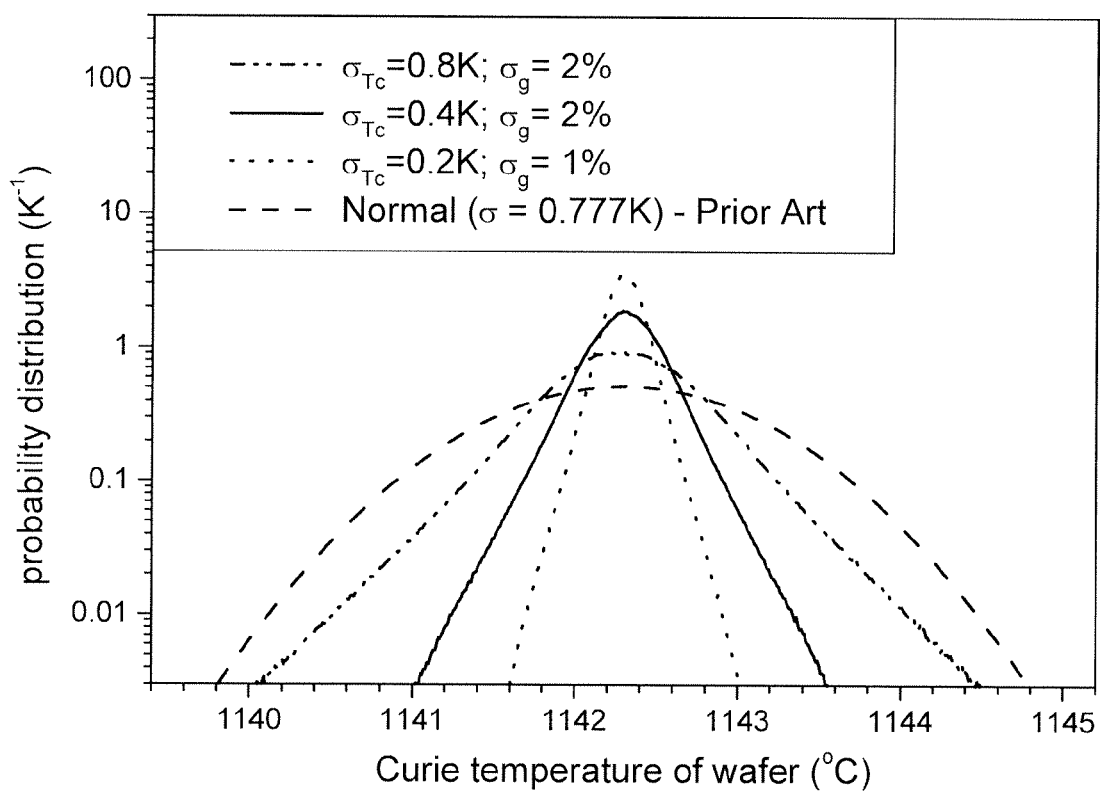
FIG. 6 illustrates the probability of producing wafers in a given range of Curie temperature for two implementations or prior art.

The performance of the present invention was simulated by a monte-carlo method that used the distributions as described above and also handled the SPC procedure as outlined. 10,000 recipe correction events were simulated. For each recipe simulation, the following steps were conducted: a) The powder raw material had an assumed composition such that the $\zeta$ correction from the test recipe to produce congruent melts was uniformly distributed between −0.001 and +0.001. b) The simulated crystal growth from the test recipe had samples cut at fractional melt values of 7% and 80% with Gaussian deviations $\sigma=2\%$, or $\sigma=1\%$ as indicated in the legend of FIG. 6, and the corresponding Tc values were calculated. c) The Curie temperatures measurements were simulated by adding a Gaussian error to the result of step b) with a ranging from ±0.2K to ±0.8K as indicated in legend of FIG. 6. d) If any of the measurements was outside the SPC window, assumed to be a ±4K window centered at 1142.3° C., the result was discarded, and a second simulated Curie temperature measurement was done on the same powder composition but assuming new values for errors in g and Tc. It is clear to someone trained in the art of crystals growth and materials characterization that the SPC window and the uncertainties assumed for the measurements of Tc and g depend on the particulars of the measurement systems used. A narrower variability in powder supply for example will allow this window to be narrower without having to grow extra crystals due to an SPC violation.

In the case that an SPC violation occurred and a second crystal was evaluated, this second result was then used irrespectively of the result. The correction was calculated according to equation (16a) with the best estimate for starting melt composition using a weighted average of the two individual estimates using the relative weights of 26% for the g=7%, and 74% for g=80%. These weights are estimated based on typical melt deviations from congruency and an error propagation analysis as described in equation (17). Rather than keeping these weights fixed, more sophisticated models might calculate the best estimated weights for each composition measurement dependent on the measurement results. Alternatively, a simpler model might use equal weights for each measurement. d) The corrected recipe was then used to grow 10 crystals each "yielding" 93 wafers evenly distributed between g=6.8% and 85%. The starting melt composition for each of those 10 crystals was varied by assuming a Gaussian weighing error around the ratio $\zeta_{cor}$ or assuming $\sigma=10^{-5}$ variations. These particular values were chosen to perform the simulation resulting in the curves shown in FIG. 6, but it should be clear to a person trained in the art that the range of fractional solidified melt conversion from which the SAW substrates are produced may change depending on the crystal shape, the powder purity and the crystal growth apparatus used. Typical values for the low end are between 5% and 15%, and typical values for the highest solidified melt conversion in SAW substrate growth range from 80% to over 90%.

The distribution of Curie temperature measurements for all the simulated recipe corrections and growth runs, totaling 9.3 million wafers, was calculated and is shown in FIG. 6 as solid curve for the assumed uncertainty of ±0.4K and ±2% for the Curie measurement and the solidified melt conversion estimates. During this simulation of 10,000 weighing corrections, the SPC rule of ±4K was violated a total of 67 times, an acceptably low level. The dashed curve for comparison assumes a Gaussian distribution ($\sigma=0.777K$) in wafer Curie temperature values, equating to 1% of wafers outside the specification window of ±2K.

The dotted curve is a similar simulation to the solid curve, but with assumed improvement in both the Curie temperature measurement accuracy ($\sigma=0.2K$) and in fractional melt estimation accuracy of the samples ($\sigma=1\%$). The SPC rule, still assumed to be ±4K, for this simulation run was violated only one time, indicating that the Curie measurement variability is responsible for most SPC violations.

A third simulation of 10,000 weighing recipe corrections was performed, but this time with a less accurate Curie temperature measurement system, characterized by a normal deviation of $\sigma=0.8K$. The corresponding curve is shown in FIG. 6 as dash-dot-dot line, broader than the other two simulation results, but having narrower peak than the Normal distribution with AQL of 1% in the specification window. The SPC rule was violated 321 times, still acceptable but clearly much more often than with better Curie measurement control. It can be seen from the results in FIG. 6 that using the present invention leads to a dramatic narrowing of Curie temperature values for the wafer distribution, resulting in better control of the center frequency of the SAW devices manufactured from those wafers. In the prior art specification window for LN SAW wafers, ±2K, typical specification interpretation allows for 1% of wafers having Curie measurements outside the window. The ordinate of FIG. 6 is shown on a logarithmic scale, drawing attention to the probability distribution away from the peak. The Normal distribution is seen as a parabola in this representation, as expected. The tails in the simulation results show as straight lines, reminiscent of the Laplace probability distribution. Using equation (12), the ±2K window equates to a crystal composition range of ±0.051 mol %, or ±560 ppm of SAW velocity variability from the center value. In contrast, the solid curve had only 78 wafers outside this window, equating to a failure rate of only 8.2 ppm within that window, and the dashed curve, resulting from better experimental composition measurement accuracy for the test crystal samples, produced no wafers outside this window. The dash-dot-dot curve had 0.36% of wafers falling outside the specification window, still better than the Normal distribution. The simulations allow us to estimate the improvement over the prior art, as measured by the composition window narrowing into which 99% of all wafers falls. For the solid curve, this window is ±0.86K, and for the dashed curve, it is only ±0.44K, and for the dash-dot-dot curve, it is ±1.65K. Using equation (12), this equates to a crystal composition range of ±0.022 mol %, ±0.011 mol % and ±0.042 mol %, respectively, or ±240 ppm, ±125 ppm, and ±460 ppm, respectively for the SAW velocity deviation from the center value. The range where less than 10 ppm of wafers fail is ±1.9K for the solid curve, and ±1K for the dashed curve. Even for the dash-dot-dot curve, the wafers failing a specification window of ±1.9K constitutes less than 0.5% or 5000 ppm of produced wafers.

Another way to describe the improvement provided by the present invention is the composition range that only a very small fraction of wafers are failing. Suppose the wafer user requires less than 0.1%, or 1000 ppm of wafers failing a specification window. Assuming the Normal distribution shown as dashed curve, a window of ±2.34K contains 99.9% of wafers, equivalent to a composition range of ±0.06 mol % or a SAW velocity deviation from the center value for 128RY LN of ±655 ppm. Given the growth segregation of $Li_2O$ however, this is not a very accurate model because the Normal distribution underestimates the influence of the bottom wafers. The dash-dot-dot curve, even though the center peak is narrower, will actually require a larger window of ±2.42K to contain 99.9% of all wafers. If it is important to eliminate outliers, better control of the composition determination measurement is required. Another simulation, now assuming $\sigma(Tc)=0.6K$ and $\sigma(g)=1\%$ was performed (curve not shown in FIG. 6). The 1000ppm failure rate requirement in this case translates to a Curie temperature window of ±1.84K, equivalent to composition range ±0.047 mol % or SAW velocity deviation from the center value of ±515 ppm.

Without the methods disclosed herein to simulate the compositional segregation during growth, such estimates for failure rates are not possible. The Normal distribution is not an adequate model because the segregation at high solidified melt fractions accelerates, augmenting the "tails" of the distribution. With moderate experimental accuracy of ±0.6K for Curie temperature measurement (or equivalent method that gives similar compositional measurement accuracy) and easily achievable accuracy for fractional melt estimation accuracy of ±2%, the present invention allows the production of a SAW wafer substrates with SAW property parameter distribution guaranteed to have failure rates less than 0.1%, or 1000 ppm in a typical specification window of ±2K or ±1.9K. Alternatively, the failure rate within a given specification window can be reduced dramatically from 1% to 0.36% or less, depending on the accuracy of the test crystal composition measurements.

Other embodiments of the invention will be apparent to those skilled in the art from consideration of the specification and practice of the invention disclosed herein. It is intended that the specification and examples be considered as exemplary only, with a true scope and spirit of the invention being indicated by the appended claims.

What is claimed is:

1. A method of growing crystals from congruently melting compounds with negligible volatilization, comprising:
    establishing a model that predicts crystal composition variations by using a distribution coefficient as a function of slight deviations from congruency in melt composition;
    measuring the composition of one or more crystal samples made from an initial melt composition and determine a deviation of crystal composition from congruency;
    determining a source material composition correction to the initial melt composition based on the measured deviation and the model by using the distribution coefficient as the function of slight deviations from congruency in melt composition; and
    growing crystals using the source material composition correction to yield reproducible material for consistent surface acoustic wave (SAW) substrate manufacturing.

2. The method of claim 1, wherein the crystal is selected from at least one of, LN, $Bi_{12}SiO20$, and $Bi_{12}GeO_{20}$.

3. The method of claim 1, wherein the crystal is LN and the congruently melting compounds are reacted from $Nb_2O_5$ and $Li_2CO_3$.

4. The method of claim3, further comprising:
    growing one or more test crystals from $Nb_2O_5$ and $Li_2CO_3$ reacted powders.

5. The method of claim 1, further comprising:
    determining an initial weighing recipe of the source materials having a powder weight ratio or a molar fraction.

6. The method of claim 5, further comprising:
    cutting test crystals at a one or more solidified fractions; and
    measuring composition of the test crystals.

7. The method of claim 6, further comprising:
    using composition estimates to calculate a weighting recipe correction 8. The method of claim 1, further comprising:
    creating wafers within a range of composition values corresponding to a distribution of acoustic wave velocity values deviating no more than ±515 ppm from the center value.

9. The method of claim 1 further comprising:
    manufacturing wafers within a range of composition values corresponding to a distribution of acoustic wave velocity values where no more than 0.1% of wafers have velocity values that deviate by more than ±515 ppm from the center value.

10. The method of claim 1, further comprising:
    manufacturing wafers within a range of composition values corresponding to a distribution of acoustic wave velocity values deviating no more than ±460 ppm from the center value.

11. The method of claim 1 further comprising:
    manufacturing wafers within a range of composition values corresponding to a distribution of acoustic wave velocity values where no more than 1% of wafers have velocity values that deviate by more than ±460 ppm from the center value.

12. The method of claim 1, further comprising:
    manufacturing wafers within a range of composition values corresponding to a distribution of acoustic wave velocity values deviating no more than ±240 ppm from the center value.

13. The method of claim 1 further comprising:
    manufacturing wafers within a range of composition values corresponding to a distribution of acoustic wave velocity values where no more than 1% of wafers have velocity values that deviate by more than ±240 ppm from the center value.

* * * * *